(12) United States Patent
Benveniste

(10) Patent No.: US 6,885,014 B2
(45) Date of Patent: Apr. 26, 2005

(54) SYMMETRIC BEAMLINE AND METHODS FOR GENERATING A MASS-ANALYZED RIBBON ION BEAM

(75) Inventor: Victor M. Benveniste, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 398 days.

(21) Appl. No.: 10/210,124

(22) Filed: Jul. 31, 2002

(65) Prior Publication Data
US 2003/0205683 A1 Nov. 6, 2003

Related U.S. Application Data

(63) Continuation-in-part of application No. 10/136,047, filed on May 1, 2002, now Pat. No. 6,664,547.

(51) Int. Cl.[7] ............................................. H01J 37/317
(52) U.S. Cl. ......................... 250/492.21; 250/396 ML; 250/398
(58) Field of Search .................... 250/492.21, 396 ML, 250/396 R, 398

(56) References Cited

U.S. PATENT DOCUMENTS

| 4,447,732 | A | 5/1984 | Leung et al. |
|---|---|---|---|
| 5,350,926 | A | 9/1994 | White et al. |
| 5,497,006 | A | 3/1996 | Sferlazzo et al. |
| 5,661,308 | A | 8/1997 | Benveniste et al. |
| 5,760,405 | A | 6/1998 | King et al. |
| 5,825,038 | A | 10/1998 | Blake et al. |
| 5,834,786 | A | 11/1998 | White et al. |
| 6,016,036 | A | 1/2000 | Brailove |
| 6,060,718 | A | 5/2000 | Brailove et al. |
| 6,135,128 | A | 10/2000 | Graf et al. |
| 6,207,963 | B1 | 3/2001 | Benveniste |
| 6,207,964 | B1 | 3/2001 | McIntyre et al. |
| 6,242,750 | B1 | 6/2001 | Takahashi et al. |
| 6,294,862 | B1 | 9/2001 | Brailove et al. |
| 6,323,497 | B1 * | 11/2001 | Walther ................. 250/492.21 |
| 6,414,329 | B1 | 7/2002 | Benveniste et al. |
| 6,541,781 | B1 | 4/2003 | Benveniste et al. |
| 6,635,880 | B1 * | 10/2003 | Renau ................. 250/396 ML |
| 6,759,665 | B1 | 7/2004 | Benveniste et al. |

OTHER PUBLICATIONS

"Charged Particle Beams", Acceleration and Transport of Neutralized Ion Beams, Stanley Humphries, Jr., 1990, pp. 528–534.

* cited by examiner

Primary Examiner—Kiet T. Nguyen
(74) Attorney, Agent, or Firm—Eschweiler & Associates, LLC

(57) ABSTRACT

Ion implantation systems and beamlines therefor are disclosed, in which a ribbon beam of a relatively large aspect ratio is mass analyzed and collimated to provide a mass analyzed ribbon beam for use in implanting one or more workpieces. The beamline system comprises two similar magnets, where the first magnet mass analyzes the ribbon beam to provide an intermediate mass analyzed ion beam, and the second magnet collimates the intermediate beam to provide a uniform mass analyzed ribbon beam to an end station. The symmetrical system provides equidistant beam trajectories for ions across the elongated beam width so as to mitigate non-linearities in the beam transport through the system, such that the resultant mass analyzed beam is highly uniform.

31 Claims, 13 Drawing Sheets

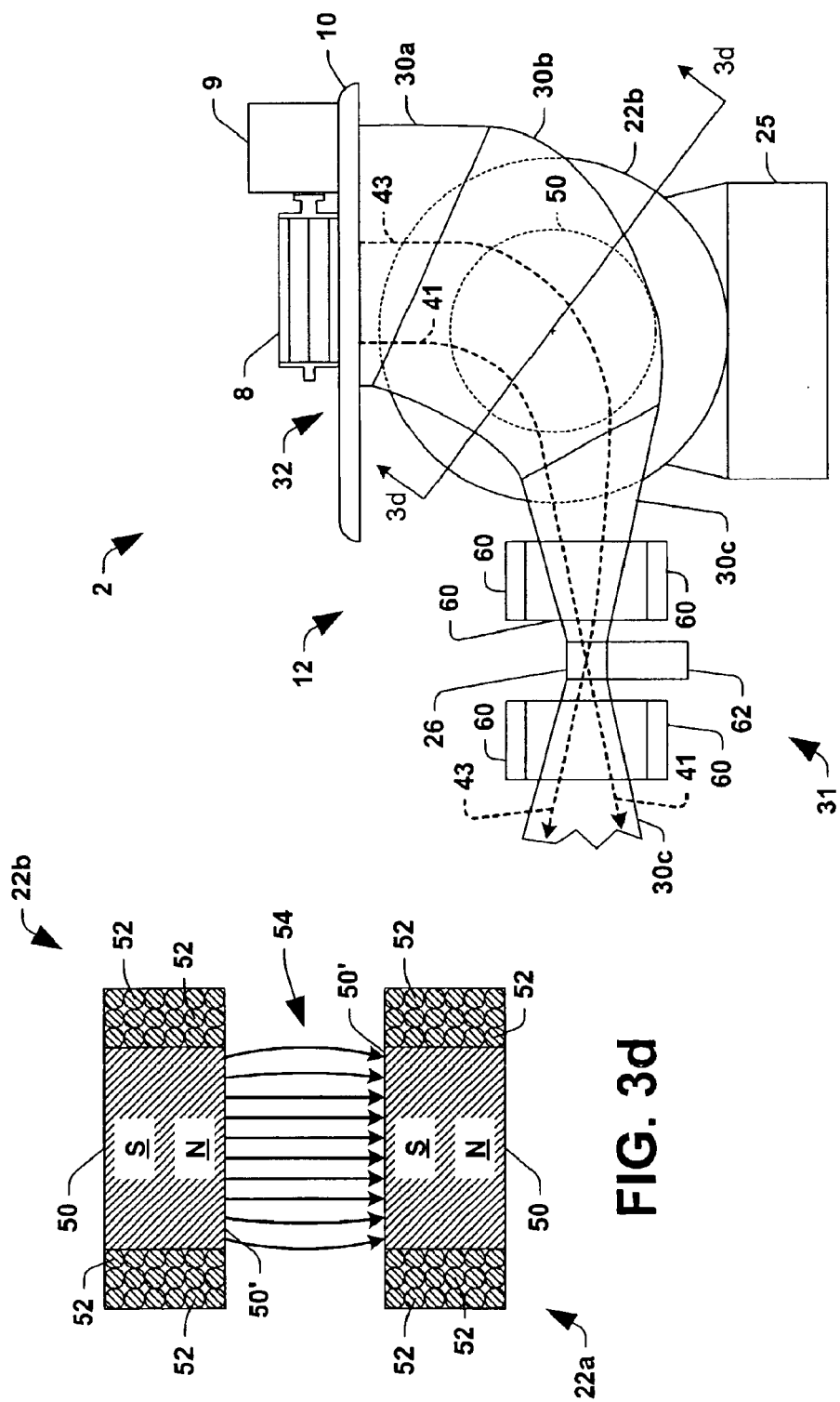

SYMMETRIC BEAMLINE AND METHODS FOR GENERATING A MASS-ANALYZED RIBBON ION BEAM

RELATED APPLICATION

This application is a Continuation-In-Part of Ser. No. 10/136,047 filed May 1, 2002, now U.S. Pat. No. 6,664,547, which is entitled "Ion Source Providing Ribbon Beam with Controllable Density Profile".

FIELD OF THE INVENTION

The present invention relates generally to ion implantation systems, and more particularly to symmetric beamline systems and methods for generating mass-analyzed ribbon ion beams in an ion implantation system.

BACKGROUND OF THE INVENTION

Ion implantation systems are used to dope semiconductors with impurities in integrated circuit manufacturing. In such systems, an ion source ionizes a desired dopant element, which is extracted from the source in the form of an ion beam of desired energy. The ion beam is then directed at the surface of a semiconductor wafer in order to implant the wafer with the dopant element. The ions of the beam penetrate the surface of the wafer to form a region of desired conductivity, such as in the fabrication of transistor devices in the wafer. The implantation process is typically performed in a high vacuum process chamber which prevents dispersion of the ion beam by collisions with residual gas molecules and which minimizes the risk of contamination of the wafer by airborne particles. A typical ion implanter includes an ion source for generating the ion beam, a beamline system including mass analysis apparatus for mass resolving the ion beam using magnetic fields, and a target chamber containing the semiconductor wafer to be implanted by the ion beam. For high energy implantation systems, an acceleration apparatus is provided between the mass analysis magnet and the target chamber for accelerating the ions to high energies.

In order to achieve a desired implantation for a given application, the dosage and energy of the implanted ions may be varied. The ion dosage controls the concentration of implanted ions for a given semiconductor material. Typically, high current implanters are used for high dose implants, while medium current implanters are used for lower dosage applications. The ion energy is used to control junction depth in semiconductor devices, where the energy levels of the beam ions determine the degree of depth of the implanted ions. The continuing trend toward smaller and smaller semiconductor devices requires a beamline construction which serves to deliver high beam currents at low energies. The high beam current provides the necessary dosage levels, while the low energy permits shallow implants. In addition, the continuing trend toward higher device densities on a semiconductor wafer requires careful control over the uniformity of implantation beams being scanned across the workpiece.

Another continuing trend is toward larger and larger semiconductor wafer sizes, such as 300 mm diameter wafers. Coupled with higher device densities, the larger wafer size increases the cost of individual wafers. As a result, control over implantation uniformity and other parameters is more critical than ever in avoiding or mitigating the cost of scrapping wafers. In many ion implantation systems, a small ion beam (e.g., a pencil beam) is imparted onto a wafer target through mechanical and/or magnetic scanning, in order to provide the desired implantation. The ion beam is shaped according to the ion source extraction opening and subsequent shaping apparatus, such as the mass analyzer apparatus, resolving apertures, quadrupole magnets, and ion accelerators, by which a small ion beam is provided to the target wafer or wafers. The beam and/or the target are translated with respect to one another to effect a scanning of the workpiece. Batch implanters provide for simultaneous implantation of several wafers, which are rotated through an ion beam path in a controlled fashion. Serial implanters, on the other hand, provide implantation of a single wafer at a time.

Where a small ion beam is used, the serial implanters provide a relatively complex target scanning system to impart the beam across the wafer in a uniform manner. For example, mechanical translators are provided to translate the wafer in a single axis, while magnetic apparatus are provided to scan the beam in a perpendicular axis to achieve a raster type scanning of the wafer surface. However, in order to reduce the complexity of such implantation systems, it is desirable to reduce the cost and complexity of target scanning systems, and to provide for elongated ribbon-shaped ion beams. For a ribbon beam of sufficient longitudinal length, a single mechanical scan may be employed to implant an entire wafer, without requiring additional mechanical or magnetic raster-type scanning devices. Such a beam may be employed with serial as well as batch type target scanning systems. However, where a ribbon beam is used in such a single-scan system, it is necessary to ensure that the beam is uniform across the width, in order to provide for uniform implantation of the wafer or wafers. In some prior systems, a small ion beam is mass analyzed, and then collimated to provide a mass analyzed ribbon beam for implanting wafers. Such systems, however, suffer from difficulties in providing a high current beam at low energies due to the high beam density associated therewith, wherein the high beam density tends to result in beam blow-up due to space charge. Accordingly, it is desirable to provide improved ion implantation apparatus and methodologies by which uniform ribbon beams may be provided for implanting semiconductor wafers.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The present invention is directed to methods and apparatus for implanting workpieces using an ion beam, by which the above mentioned and other shortcomings associated with the prior art may be overcome or mitigated. In particular, the invention provides implantation systems wherein a relatively wide ribbon-shaped ion beam is produced by an ion source, which is then provided to a symmetric beamline system for mass analysis and collimating. The resulting mass analyzed ion beam has substantially the same transverse width, height, and aspect ratio as the ribbon beam from the source.

The symmetry of the beamline system provides one to one imaging of the source ions of a desired mass onto the target wafer, thereby facilitating control of process parameters such as dose uniformity and implant angular integrity. The invention may be advantageously employed in providing ribbon beams having transverse widths of about 300 mm or more (e.g., 400 mm wide in one implementation) having uniform density profiles, whereby single-scan implantation of large (e.g., 300 mm) wafers can be achieved without complex and costly raster scanning apparatus. Thus, the invention facilitates simplification of implantation systems. In addition, the invention provides a relatively large ion beam cross-section throughout most of the beamline system, whereby the space charge is diffused, which is highly conducive to maintaining beam integrity in low energy implantation applications. Another advantage of the beamline system symmetry is that the total path length or travel distance of ions from the source to the target is nearly constant for all portions of the ribbon beam. Consequently, transport losses are approximately uniform across the beam, and hence do not adversely impact implantation uniformity. Moreover, the architectures of the invention helps in preventing contaminants and particles from the source and beam dumps from reaching the target wafer.

Ion implantation systems and beamline systems therefor are provided, in which a ribbon beam of a relatively large aspect ratio is mass analyzed and collimated to provide a mass analyzed ribbon beam for use in implanting one or more workpieces. The system provides a symmetrical beam path by which the ribbon-beam profile, including aspect ratio, of the initial and analyzed beams are virtually the same. In this regard, the ions traveling through the beamline encounter equidistant trajectories, whereby the travel distance for each ion is the same as that of other ions in the beam. In one example, the beamline system comprises two similar magnets, where the first magnet mass analyzes the ribbon beam to provide an intermediate mass analyzed ion beam, and the second magnet collimates the intermediate beam to provide a uniform mass analyzed ribbon beam to an end station. The symmetrical system provides equidistant beam trajectories for ions across the elongated beam width so as to mitigate non-linearities in the beam transport through the system, such that the resultant mass analyzed beam is highly uniform.

According to one aspect of the invention, an ion implantation system is provided for implanting one or more workpieces with an ion beam. The system comprises an ion source, a beamline system including a mass analyzer, and an end station, which may be a serial or batch implantation station for supporting and/or translating one or more workpieces. The ion source produces an elongated or ribbon-shaped ion beam along a longitudinal beam path having a large aspect ratio of transverse width to height. The mass analyzer receives the elongated ion beam and focuses the beam into a narrow slit that corresponds to a resolving aperture. Ions having differing masses are thus blocked by the aperture, thereby providing ions of only a desired mass.

In one implementation of the invention, the beamline system comprises first and second generally similar magnets, such as electro-magnets, positioned along the beam path, where the first magnet mass analyzes the beam from the ion source, and the second magnet collimates or shapes the resulting intermediate mass analyzed bean to provide a ribbon beam of similar or corresponding width and aspect ratio to input beam, which is then imparted on a workpiece in the end station. The first magnet provides a first magnetic field to the elongated ion beam from the ion source to direct individual ions of a desired mass along the path and to deflect ions of undesired mass away from the path. A resolving aperture may be provided downstream of the first magnet, so as to selectively pass only ions of the desired mass to the second magnet. The second magnet provides a second magnetic field to the ions of the desired mass along the path to direct such ions to the end station as an elongated mass analyzed ion beam comprising an aspect ratio substantially similar to that of the source beam.

The first and second magnetic fields thus operate in symmetrical fashion to guide individual ions of the desired mass to the end station through generally equal distances between the ion source and the end station. The system may further comprise a beamguide defining a beam cavity through which the ion beam travels from an entrance end to an exit end, and quadrupole magnets positioned proximate the resolving aperture to enhance beam confinement and integrity within the beamguide. Multi-cusped magnetic fields may also be provided along at least a portion of the beam path, which may be combined with RF or microwave excitation via a waveguide in the beamguide, so as to create an electron-cyclotron resonance (ECR) condition therein for beam integrity near the resolving aperture.

Another aspect of the invention provides methods for implanting a workpiece using an ion beam in an ion implantation system. The methods comprise creating an elongated ion beam having a first aspect ratio, mass analyzing the elongated ion beam using a first magnetic field, and collimating the ion beam using a second magnetic field to provide an elongated mass analyzed ion beam having a second aspect ratio substantially the same as the first aspect ratio. The methods further comprise providing at least a portion of the elongated mass analyzed ion beam to one or more workpieces for implantation with ions from the elongated mass analyzed ion beam.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 2b is a top plan view further illustrating the ion implantation system of FIG. 2a;

FIG. 3b is a partial side elevation view further illustrating the beam path of FIG. 3a;

FIG. 3d is a partial top plan view in section illustrating one magnet and associated magnetic field of the ion implantation system;

FIG. 3e is a partial side elevation view illustrating a portion of the beam path of FIGS. 3a–3c together with quadrupole magnets and a waveguide proximate a resolving aperture in the ion implantation system;

DETAILED DESCRIPTION OF THE INVENTION

Figure 1:
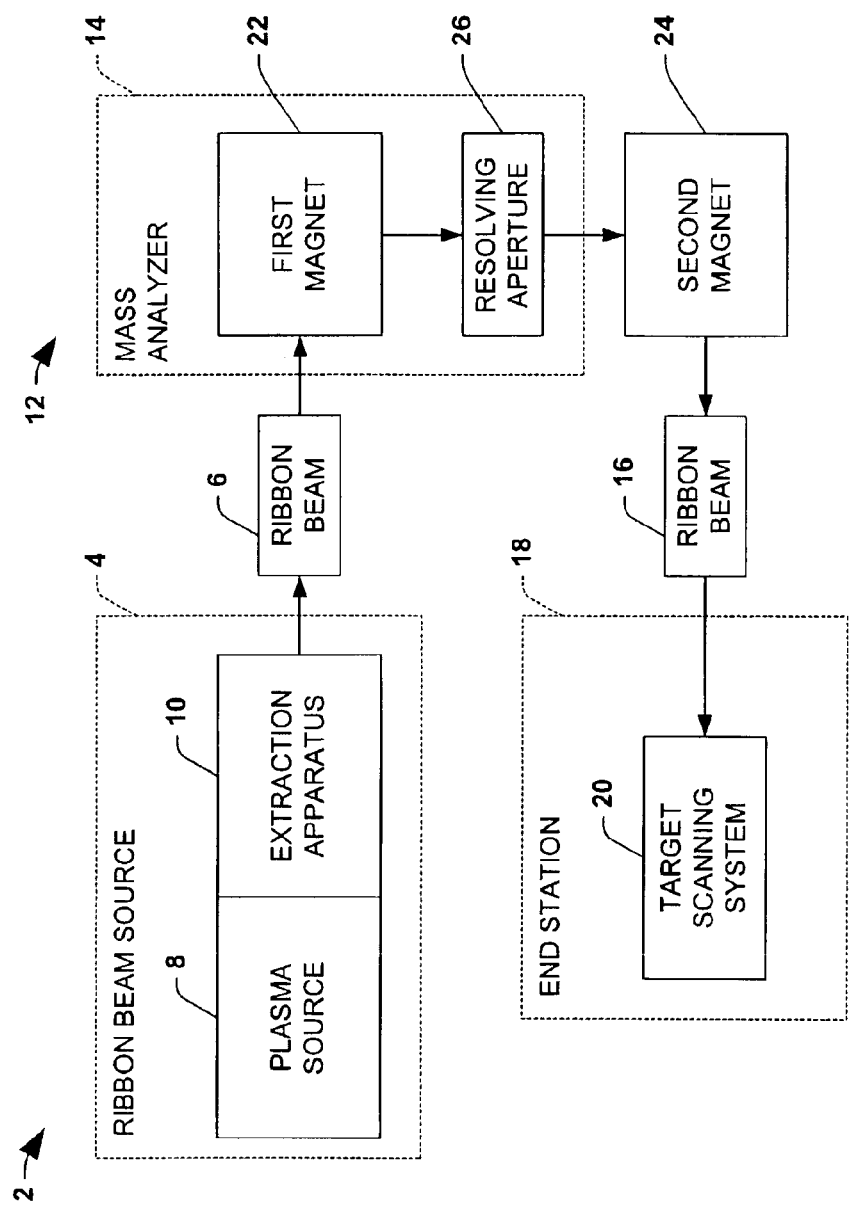
FIG. 1 is a schematic diagram illustrating an ion implantation system in accordance with an aspect of the present invention.

The present invention will now be described with reference to the drawings wherein like reference numerals are used to refer to like elements throughout. The invention provides methods and systems for provision of a mass analyzed ribbon-beam for ion implantation of workpieces such as semiconductor wafers. One implementation of the invention is illustrated and described hereinafter with respect to the drawing figures. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

Figure 2A:
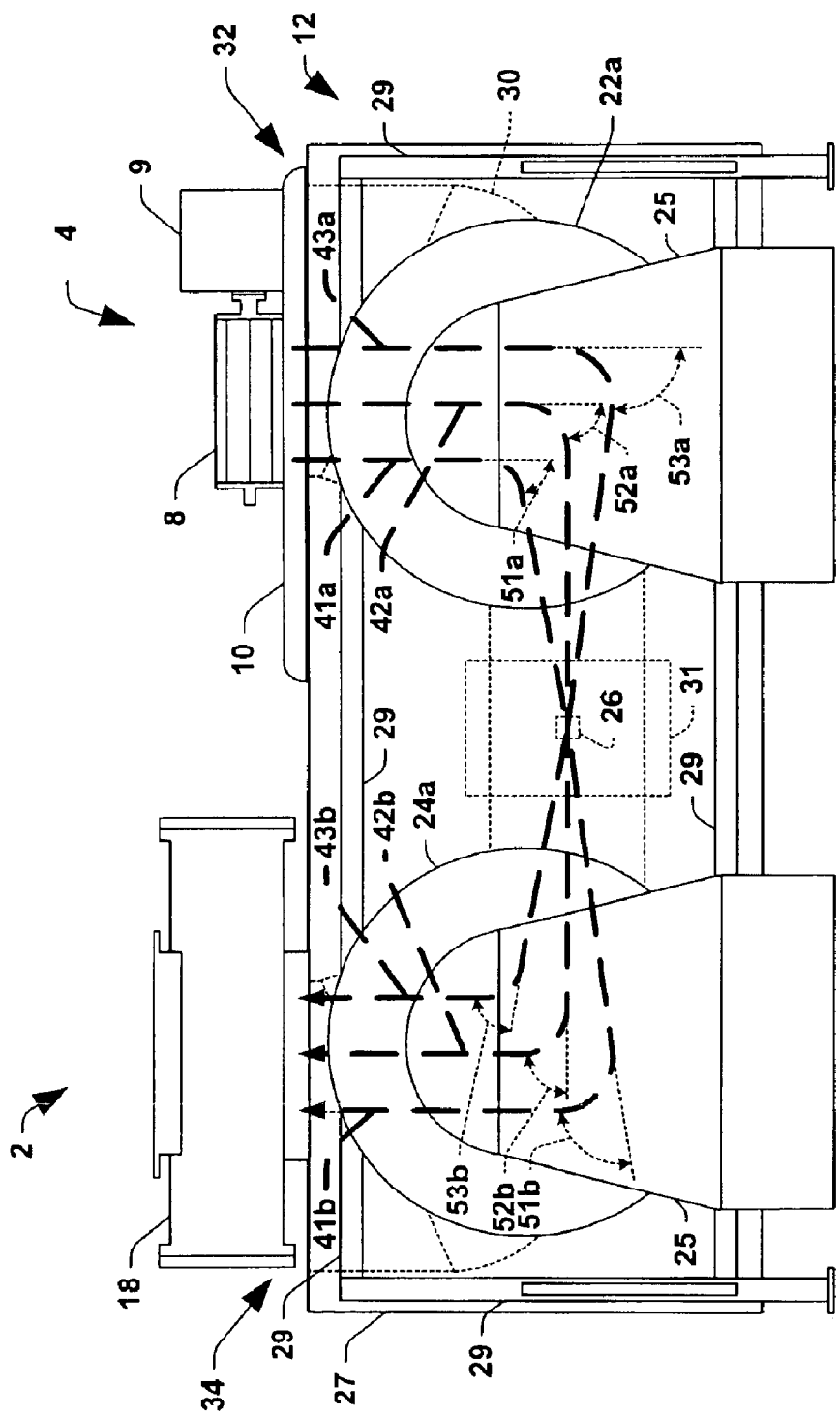
FIG. 2a is a front elevation view illustrating an exemplary ion implantation system in accordance with the present invention.
Figure 2B:
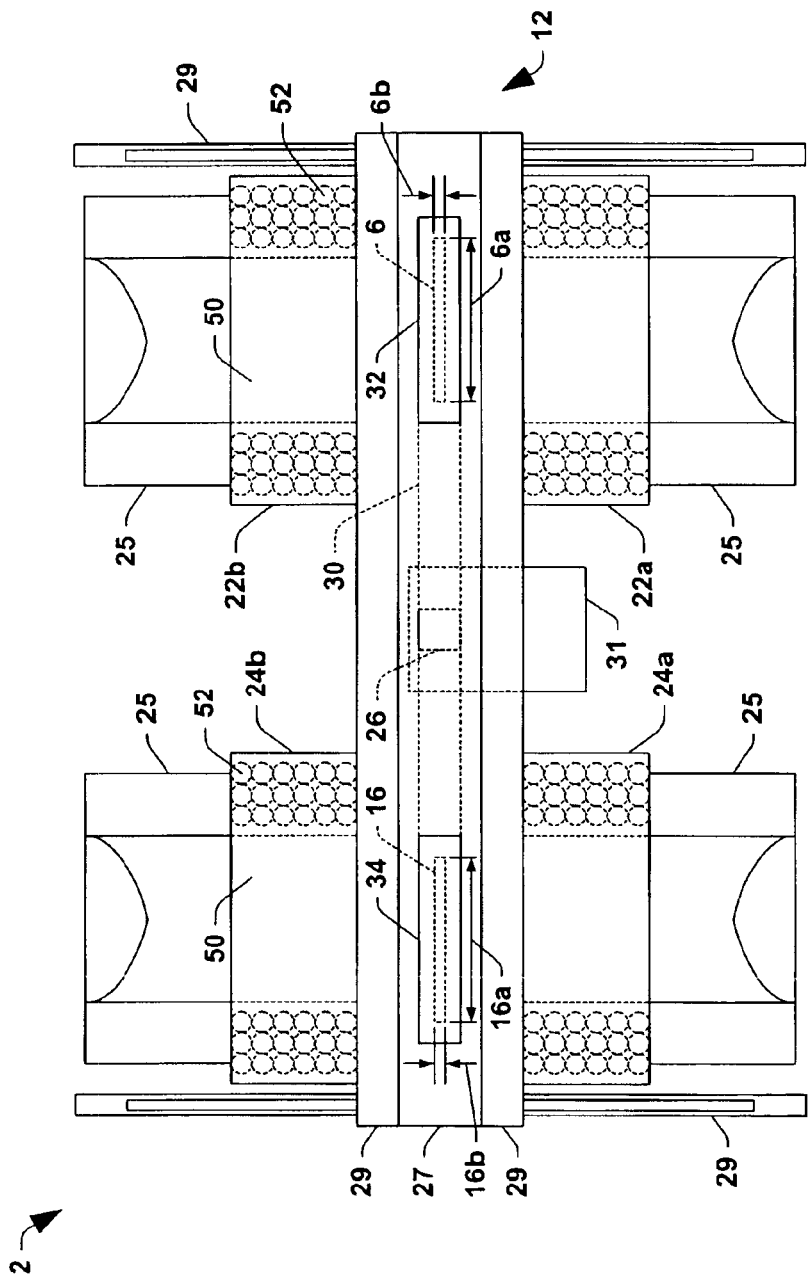
Figure 2C:
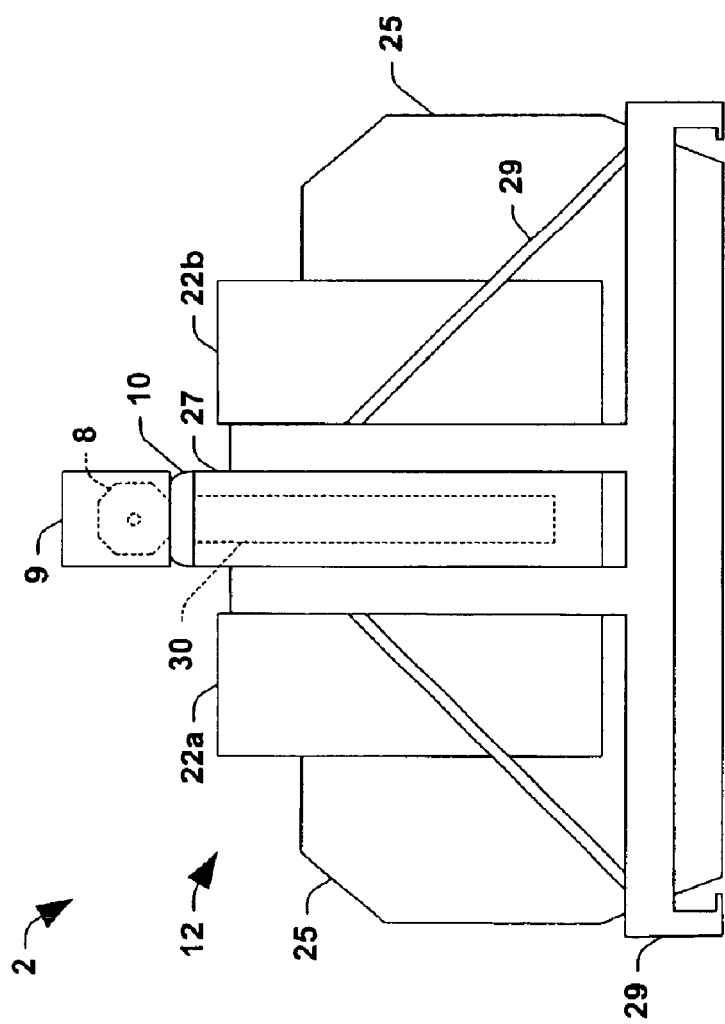
FIG. 2c is an end elevation view further illustrating the ion implantation system of FIGS. 2a and 2b.

Referring initially to FIGS. 1, and 2a–2c, the invention provides an ion implantation system 2 comprising an ion source 4 for producing an elongated (e.g., ribbon-shaped) ion beam 6 along a longitudinal beam path. The ion beam source 4 includes a plasma source 8 with an associated RF excitation power source 9 and extraction apparatus 10, which may be of any design by which an elongated beam 6 of large aspect ratio is provided. For instance, the plasma source 8 may comprise a relatively long plasma confinement chamber from which a ribbon-beam is extracted using a high aspect ratio extraction slit (not shown) in the extraction apparatus 10. As illustrated and described in greater detail below with respect to FIGS. 5a and 5b, the ribbon-beam 6 comprises a transverse width 6a (FIG. 2b) and a transverse height 6b defining a first aspect ratio, wherein the transverse width 6a is much larger than the transverse height 6b. It is noted that the dimensions of the ion beams 6 and 16 illustrated in FIGS. 2a and 2b are not necessarily drawn to scale. For example, in the illustrated system 2, the width 6a of the elongated ion beam 6 extracted from the plasma source 8 is more than about 300 mm, such as about 400 mm and the height 6b is a few mm.

A beamline system 12 is provided downstream of the ion source 4 to receive the beam 6 therefrom, comprising a mass analyzer 14 positioned along the path to receive the beam 6. The mass analyzer 14 operates to provide a magnetic field across the path so as to deflect ions from the ion beam 6 at varying trajectories according to mass (e.g., charge to mass ratio) in order to provide an elongated mass analyzed ion beam 16 having a second aspect ratio and profile substantially similar to the first aspect ratio. Thus, as illustrated in FIG. 2b, the width 16a (e.g., about 400 mm) and height 16b of the mass analyzed ribbon beam 16 are substantially similar to that of the source beam 6. An end station 18 is provided in the system 2, which receives the mass analyzed ion beam 16 from the beamline system 12 and supports one or more workpieces such as semiconductor wafers (not shown) along the path for implantation using the mass analyzed ion beam 16. The end station 18 includes a target scanning system 20 for translating or scanning one or more target workpieces and the elongated ion beam 16 relative to one another. The target scanning system 20 may provide for batch or serial implantation.

The beamline system 12 comprises first and second magnets 22 and 24, respectively, as well as a resolving aperture 26 in a resolving apparatus 31 along the beam path for mass analyzing and collimating functions, in order to produce the elongated mass analyzed ribbon beam 16. The magnets 22 and 24 are supported in bases 25, and further components of the beamline system 12 are supported in an enclosure 27 with a support frame 29. The first magnet 22 comprises first and second coils 22a and 22b providing a first magnetic field therebetween to the elongated ion beam 6 for mass separation of desired mass ions, as illustrated and described further below with respect to FIG. 3d. The ions traveling through the first magnetic field experience a force which directs individual ions of a desired mass along the beam path of the beamline system 12 and which deflects ions of undesired mass away from the path. The resolving aperture 26 passes only those ions of desired mass, while intercepting the undesired ions. The second magnet 24 comprises first and second coils 24a and 24b, respectively, located downstream of the first magnet 22 and the resolving aperture 26 along the path, which provide a second magnetic field to collimate the intermediate mass analyzed ion beam so as to direct individual ions of the desired mass to the end station 18 as the elongated mass analyzed ion beam 16 comprising a second aspect ratio substantially similar to the first aspect ratio.

The magnets 22 and 24 in the present example are substantially identical, and provide similar first and second magnetic fields, by which a symmetrical beam path is established through the beamline system 12. In this manner, the first and second magnetic fields guide individual ions of the desired mass across the width of the ion beam 6 at the ion source 4 to the end station 18 such that the individual ions travel generally equal distances. In this manner, the first magnet 22 operates as a mass analyzer magnet, and the second magnet 24 operates as a collimator magnet to provide the mass analyzed ribbon beam 16 having a uniform density profile and a width of about 400 mm to the end station 18. The system 2 further comprises a beamguide 30 located along the path, which defines a beam cavity through which the ion beam 6, 16 travels from an entrance end 32 to an exit end 34. The magnets 22 and 24 provide the first and second magnetic fields across the path through the beam cavity of the beamguide 30 so as to guide individual ions of a desired mass across the width of the ion beam 6 at the entrance end 32 through the beam guide 30 to the exit end 34 such that the individual ions of a desired mass travel generally equal distances therebetween.

Referring now to FIG. 2a, the beam 6 at the entrance end 32 of the beamguide 30 arrives from the source 8 as an elongated ribbon, wherein the ions are generally traveling parallel to one another (e.g., in a downward direction in FIG. 2a). Upon encountering the first magnetic field created in the beamguide 30 by the magnet 22, the ions of the beam 6 are directed generally to the left in the figure, wherein ions of a desired mass travel through the resolving aperture, and undesired ions are deflected along other trajectories so as to be intercepted by the resolving apparatus or by the side walls of the beamguide 30. By this mass separation, the ion beam downstream of the aperture 26 is mass analyzed to include only ions of the desired mass. The second magnetic field from the magnet 24 thereafter collimates the mass analyzed beam into a ribbon beam 16 for use in implanting a workpiece in the end station 18.

In order to illustrate the basic beam path, three exemplary ion trajectories 41, 42, and 43 are illustrated as dashed lines in FIG. 2a, corresponding to the travel paths of three ions of a desired mass, wherein the trajectories 41–43 are not necessarily shown to scale. The first trajectory 41 comprises first and second half trajectories 41a and 41b, wherein the trajectory 41 begins at an inside end of the beam 6, and ends at an outside end of the mass analyzed ribbon beam 16. In the first half of the beamguide 30, ions traveling along the trajectory 41a are deflected at an angle 51a of less than 90 degrees by operation of the first magnetic field from the magnet 22.

Thereafter, the trajectory 41 passes through the resolving aperture 26 at a downward slope, and the second half 41b of the trajectory begins. Upon encountering the second magnetic field of the magnet 24, ions on the trajectory 41b are deflected by a second angle 51b of more than 90 degrees, wherein the sum of the angles 51a and 51b is 180 degrees by virtue of the symmetry of the beamline system 12, including the substantially similar magnets 22 and 24 and corresponding first and second magnetic fields. In this manner, ions of appropriate mass traveling along the trajectory 41 are extracted downward from the source 8 at the entrance end 32 of the beamguide 30, mass analyzed, and ultimately directed upward at a target wafer in the end station 18 at the exit end 34.

An exemplary center trajectory 42 comprises first and second half trajectories 42a and 42b, wherein ions traveling along the trajectory 42 are subjected to equal 90 degree deflections at angles 52a and 52b by the first and second magnetic fields from magnets 22 and 24, respectively. It is noted that the total travel distances along the trajectories 41 and 42 are approximately equal. The same is true of the third exemplary trajectory 43, which comprises first and second half trajectories 43a and 43b beginning at an outside end of the beam 6 and ending at an inside end of the mass analyzed ribbon beam 16. In the first half of the beamguide 30, ions traveling along the trajectory 43a are deflected at an angle 53a of more than 90 degrees by the first magnetic field and then pass through the resolving aperture 26 at an upward slope. Upon encountering the second magnetic field along the second half trajectory 43b, ions are deflected upward by a second angle 53b of less than 90 degrees, wherein the sum of the angles 53a and 53b is 180.

In the symmetric beamline system 12, all ions along the width of the ribbon beam are thus transported along equidistant trajectories, and are each deflected a total of 180 degrees. This symmetric, one to one imaging of the source onto the target wafer advantageously facilitates control of process parameters such as dose uniformity and implant angular integrity, in applications such as single-scan implantation of large (e.g., 300 mm) wafers without complex and costly raster scanning apparatus. In addition, as illustrated further below, the system symmetry provides a relatively large ion beam cross-section throughout most of the beamline system 12. This results in space charge diffusion, which helps to maintain beam integrity in low energy implantation applications. In this regard, although illustrated in the context of the low energy serial implantation system 2, the features and aspects of the present invention are also applicable to high and/or medium energy implantation apparatus, such as those employing accelerator stages or modules, as well as to batch implantation systems.

The total path length or travel distance of ions from the source 8 to the end station 18 is essentially constant for all portions of the ribbon beam 6, 16. As a result, transport losses are approximately uniform across the beam 16, and hence do not adversely impact implantation uniformity at the end station 18. Furthermore, as illustrated and described below with respect to FIGS. 5a, 5b, and 6, the invention also contemplates the provision of beam profile adjustment apparatus by which beam uniformity at the end station 18 can be further facilitated. For example, the density profile of the source beam 6 may be adjusted in order to compensate for transport losses within the beamline system 12, resulting in a uniform density profile of the implantation beam 16.

Moreover, the architecture of the system 2 aids in preventing contaminants and particles from the source 8 and beam dumps from reaching the end station 18. It is noted at this point, that although the exemplary system 2, and the beamline system 12 thereof, provide for magnetic deflection of ions through a total of 180 degrees, that other overall deflection angles are contemplated as falling within the scope of the present invention and the appended claims. Thus, the invention specifically contemplates symmetric beamline systems (not shown) in which first and second magnets cooperate to provide either more or less than 180 degree total deflection of ions of a desired mass.

Figure 3A:
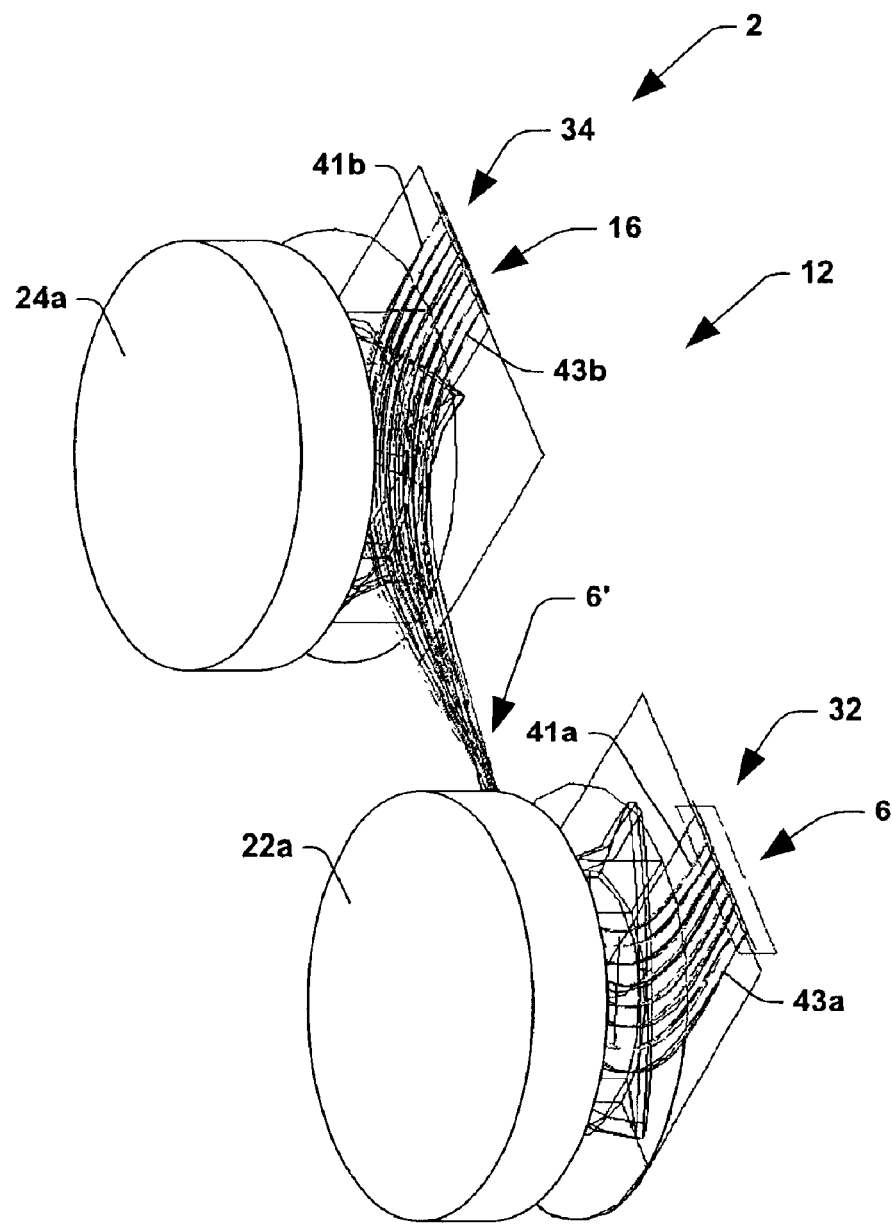
FIG. 3a is a partial perspective view illustrating an exemplary beam path through the beamline system of FIGS. 2a–2c.
Figure 3B:
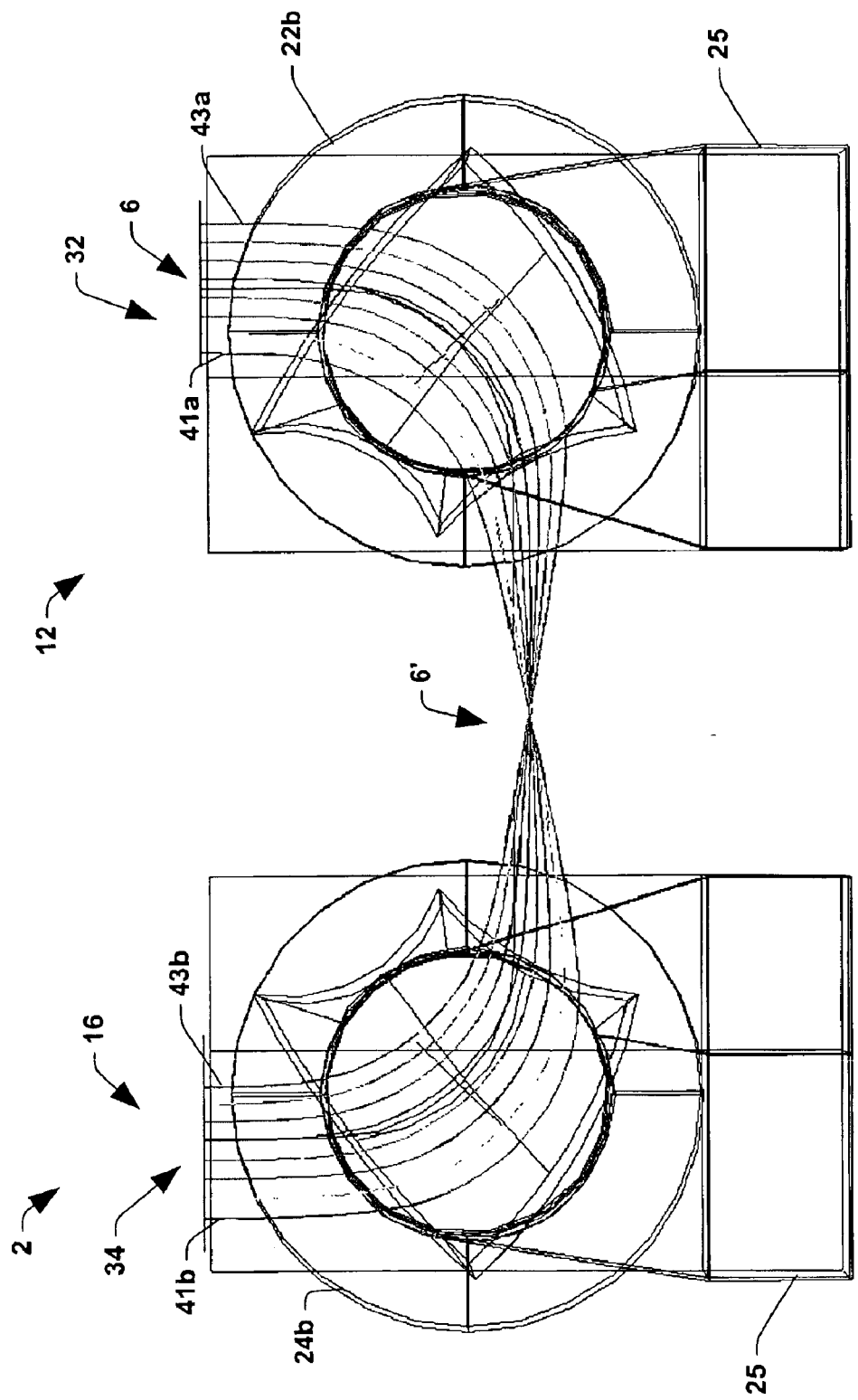
Figure 3C:
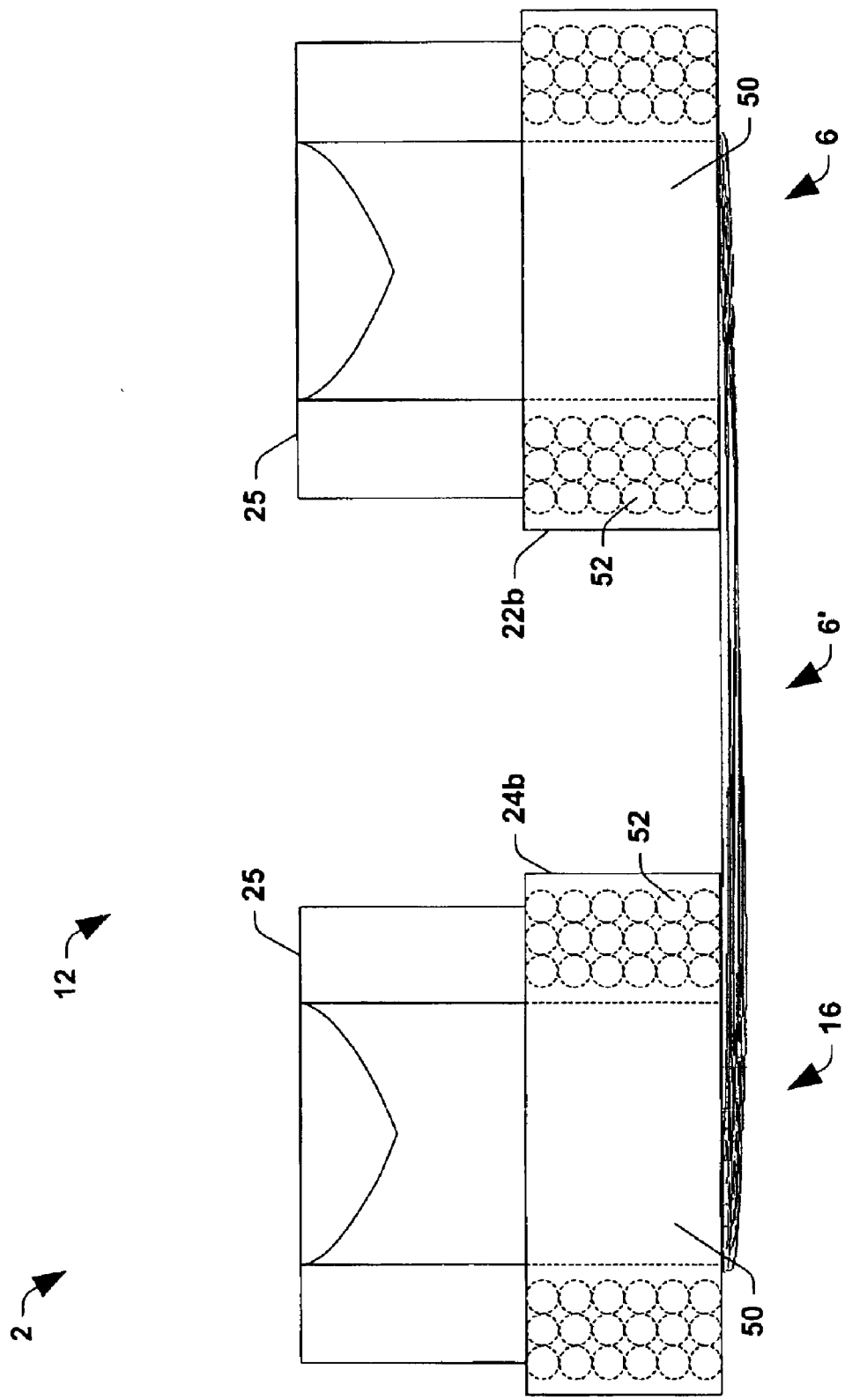
FIG. 3c is a partial top elevation view further illustrating the beam path of FIGS. 3a and 3b.

Referring now to FIGS. 3a–3c, the exemplary beam 6, 16 is further illustrated along the path of the system 2, including the exemplary trajectories 41 and 43. The beam 6 enters the beamline system 12 at the entrance end 32 having an elongated ribbon profile of about 400 mm width, and is deflected and mass analyzed by the first magnet 22, resulting in an intermediate mass analyzed ion beam 6', having an aspect ratio different from those of the ribbon beam 6, 16 at the ends 32, 34. Although illustrated in FIGS. 3a–3c as eight exemplary beam trajectories, it is to be appreciated that the beam 6, 6', 16 is a continuous distribution of ions traveling along the beam path having a uniform density profile from the source 4 to the end station 18. In FIG. 3b, a partial side elevation view of the beam 6, 6', 16 is illustrated in a dispersive plane, wherein the various trajectories thereof converge at the center.

Thus, the first magnetic field produced by the magnet 22 provides parallel to point type focusing (e.g., for ions of the desired mass) with respect to the center of the beamline system 12 in the dispersive plane to create the intermediate mass analyzed beam 6'. Conversely, the second magnetic field of the magnet 24 provides point to parallel type deflection of the ions in the intermediate mass analyzed beam 6' to provide the elongated mass analyzed ion beam 16 at the exit end 34. FIG. 3c illustrates a top plan view of the beam 6, 6', 16 in the non-dispersive plane, where it is seen that ions of the desired mass remain generally in a plane.

FIG. 3d illustrates a partial section view of the first magnet 22 taken along line 3d—3d of FIG. 3e, including first and second coils 22a and 22b. The illustration in FIG. 3d is typical of the structure of the second magnet 24 as well, whereby details of the second magnet 24 are omitted for the sake of brevity. The coils 22a and 22b are located on either side of the beamguide 30, each comprising a cylindrical core 50 around which conductive coils 52 are wound. DC electric current is supplied to the coils 52 via a power source (not shown) in a controlled fashion so as to generate a first dipole magnetic field 54 generally perpendicular to the opposing faces 50' of the cores 50. The currents are supplied so as to create magnetic North and South poles at the faces 50', where a North magnetic pole of the coil 22b faces a South pole of the coil 22a. The second magnet 24 is constructed in similar fashion to provide the second magnetic field in the beamline system 12 for collimating the beam 6' into an elongated mass analyzed ribbon beam 16. The first and second magnetic fields can be achieved in a variety of ways, using first and second magnets differing in structure from the exemplary magnets 22 and 24 illustrated and described herein, and it will be appreciated that all such implementations are contemplated as falling within the scope of the present invention.

Figure 4A:
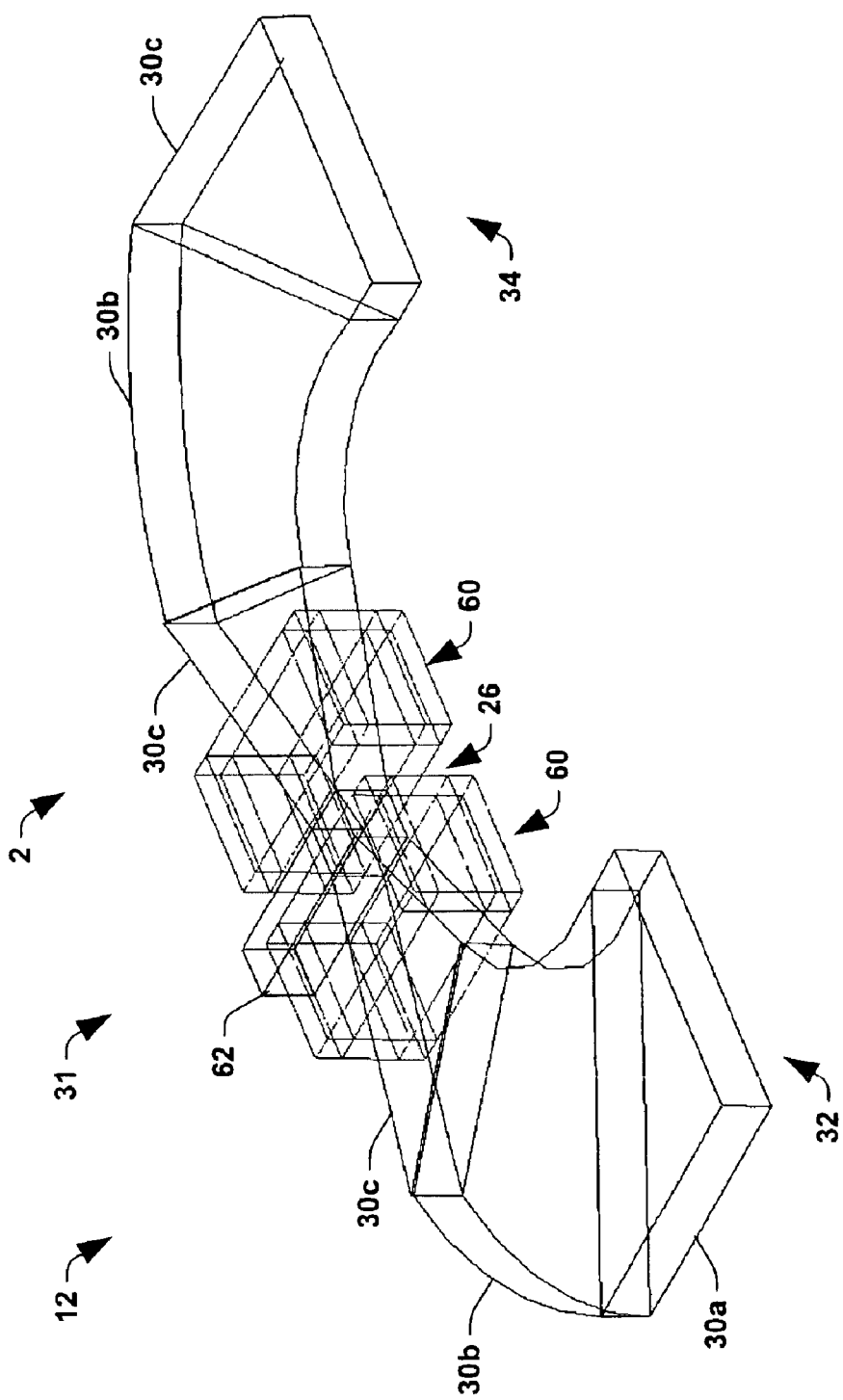
FIG. 4a is a simplified perspective view illustrating a beamguide of the ion implantation system with quadrupoles located proximate the resolving aperture.

Referring also to FIGS. 3e and 4a, an initial portion of the beamline system 12 is illustrated in FIG. 3e from the entrance end 32 to the resolving apparatus 31. The beamguide 30 comprises sections 30a, 30b, and 30c extending from the entrance end 32 to the resolving aperture 26, which define the beam path through which beam ions travel. The second half of the beamguide 30 (FIG. 4a) comprises complimentary sections 30c, 30b, and 30a extending between the resolving apparatus 31 and the exit end 34. Where the ions converge in the beam 6' proximate the resolving apparatus 31, the system 12 provides beam containment features for maintaining beam integrity. Toward that end, the exemplary beamline system 12 comprises quadrupole magnets 60 positioned around the beamguide sections 30c on either side of the resolving aperture 26, so as to adjust the location of the beam waist 6' in the event of space charge effects.

Figure 4B:
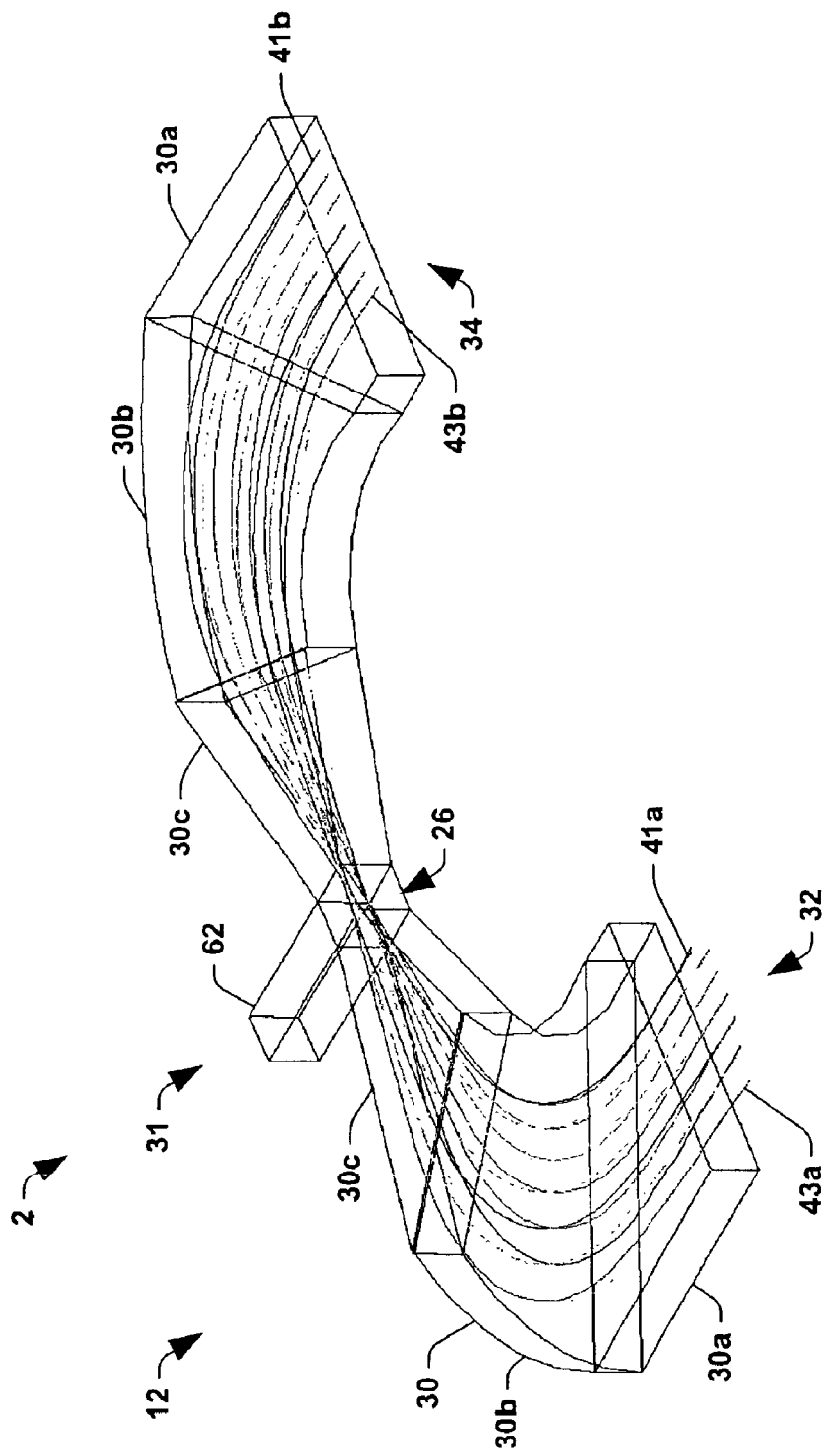
FIG. 4b is a simplified perspective view illustrating the beamguide of FIG. 4a with a waveguide proximate the resolving aperture for beam confinement along the beam path.

In addition, the beamguide 30 may further comprise a plurality of magnets, such as permanent magnets (not shown) on one or more interior walls of the sections 30c, which provide multi-cusped magnetic fields along at least a portion of the path for beam confinement near the resolving aperture 26. Referring also to FIG. 4b, the beamguide 30 may further comprise a waveguide (not shown) within the sections 30c proximate the resolving aperture 26 to which an RF or microwave power source (not shown) may be connected via a microwave feed 62. In such an implementation, the microwave power and the multi-cusped magnetic fields interact within the beamguide 30 to provide an electron-cyclotron resonance (ECR) condition for beam confinement along the path within the beamguide 30 near the resolving aperture 26.

Figure 5A:
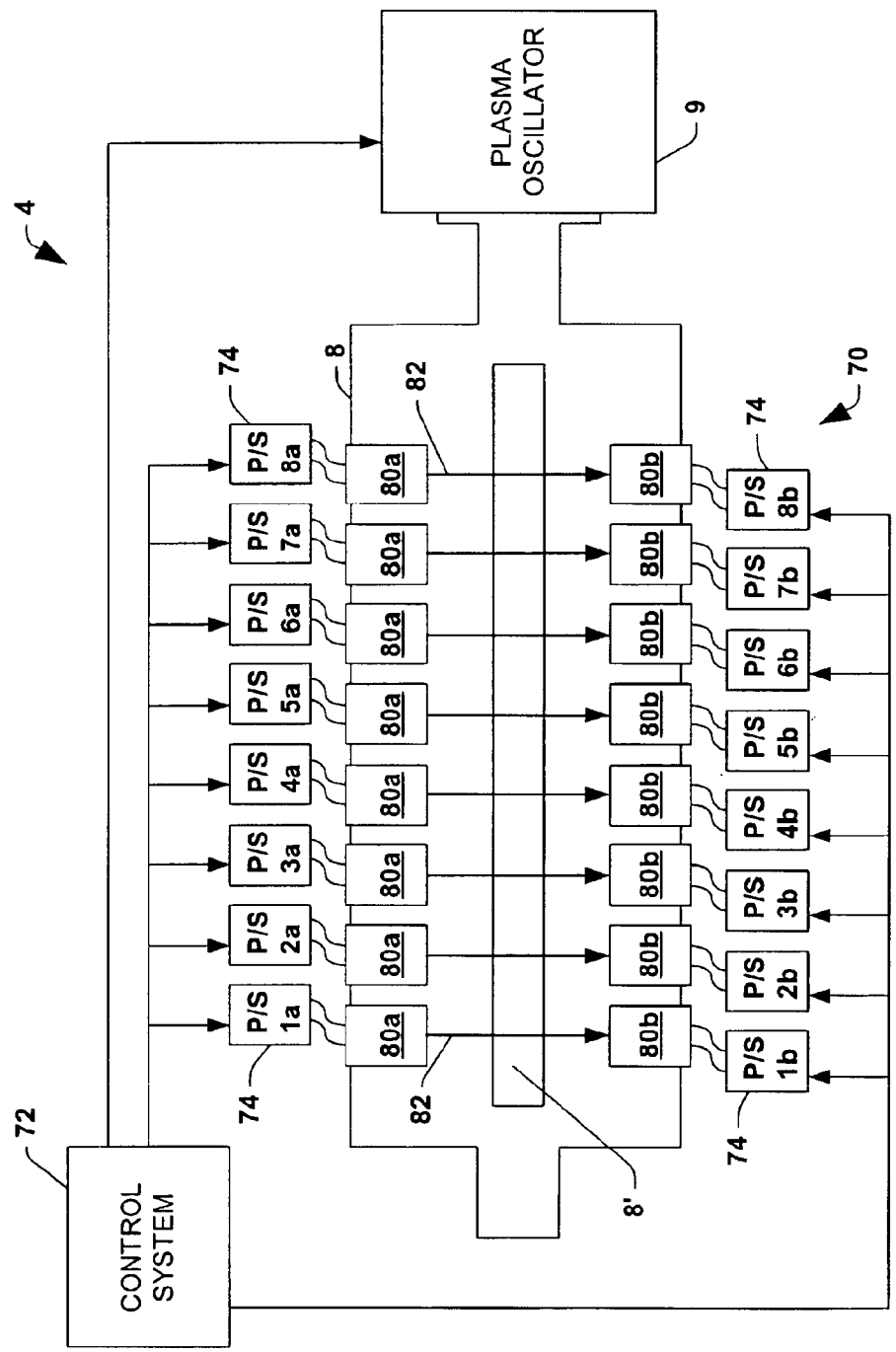
FIG. 5a is a bottom plan view illustrating an exemplary ribbon beam source with density profile control apparatus for selectively adjusting a density profile associated with an elongated longitudinal ion beam being in the ion implantation system.
Figure 5B:
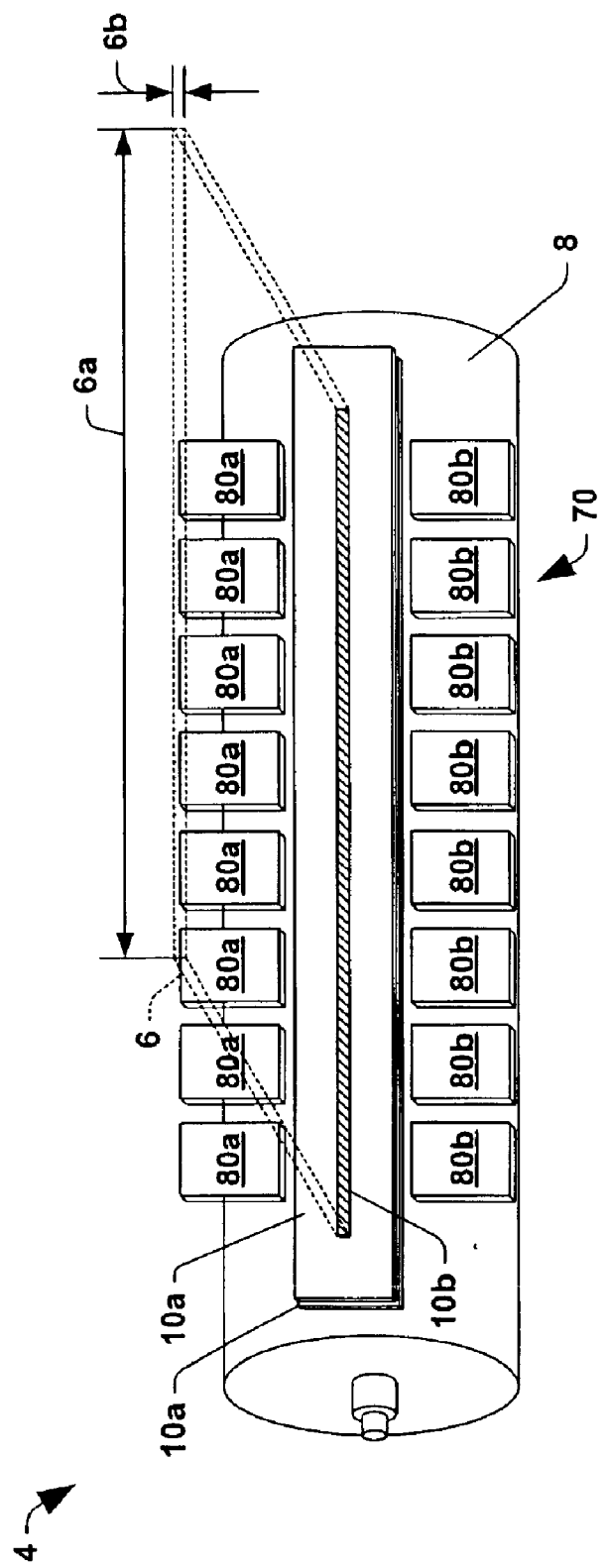
FIG. 5b is a simplified perspective view of the bottom side of the ion source of FIG. 5a illustrating an elongated ribbon-shaped ion beam extracted therefrom.

Referring now to FIGS. 5a and 5b, the invention may be carried out with any appropriate ion beam source 4 providing an elongated ion beam 6 having a transverse width 6a much greater than the transverse height 6b. The illustrated ribbon beam source 4 comprises a plasma source 8 having an elongated outer wall defining a generally cylindrical plasma confinement chamber 8' in which plasma is generated by RF excitation of a source gas using an antenna (not shown) and an RF plasma oscillator 9. Extraction apparatus 10 provides electric fields via a plurality of extraction electrodes 10a having elongated extraction slits or apertures 10b therein, where the extraction electrodes 10a, the slits 10b, and the extracted ribbon beam 6 are not necessarily drawn to scale. The source 4 provides the beam 6 having a uniform density profile along the transverse width 6a for provision to the entrance end 32 of the beamguide 30 as described above.

In accordance with another aspect of the invention, the system 2 may also comprise control apparatus 70 for selectively adjusting the density profile associated with an elongated ion beam 6 being extracted from the ribbon beam source 4. The control apparatus 70 comprises a plurality of magnet pairs 80 proximate the extraction exit opening in the plasma source wall 8 through which the beam 6 is extracted. The magnet pairs 80 individually comprising upper and lower electro-magnets 80a and 80b having energizable windings through which current may be conducted in a controlled fashion so as to provide adjustable magnetic fields 82 between the magnets 80a and 80b.

The magnets 80a and 80b are disposed on either side of the exit opening to provide adjustable magnetic fields 82 in an extraction region between the exit opening of the plasma source 8 and the extraction electrodes 10a so as to adjust the density profile of an extracted ribbon beam 6. The electro-magnets 80 are energized such that first magnets 80a provide magnetic poles of a first magnetic polarity (e.g., North in the illustrated example) facing the second magnets 80b, and the second magnets 80b provide magnetic poles of an opposite second magnetic polarity (South) facing the first magnets 80a. In this fashion, the magnets 80a and 80b of each magnet pair cooperate to provide the adjustable magnetic fields 82 in the extraction region.

The magnetic fields 82 associated with each pair of magnets 80 may be individually adjusted using a control system 72 providing control signals to DC power supplies 74 to energize coil windings associated with the individual electromagnets 80. The control system 72 is connected to the power sources 74 to individually control the currents supplied to the magnet pairs so as to individually adjust the magnetic fields 82 produced by the magnet pairs 80 in the extraction region according to a desired plasma density profile for the extracted ion beam 6. This control over the individual fields 82 allows selective restriction on the amount of ionized plasma available at the extraction region, wherein increasing the magnetic field 82 associated with a given magnet pair reduces the amount of plasma flow out of the chamber 8' proximate that pair. Thus, the transverse width 6a of the ribbon beam 6 is segmented into eight portions or slices, each being associated with a magnet pair 80. The ability to selectively restrict plasma flow out of the chamber 8' for each of the slices allows control over the density profile of the resultant beam 6 as it is extracted.

Figure 6:
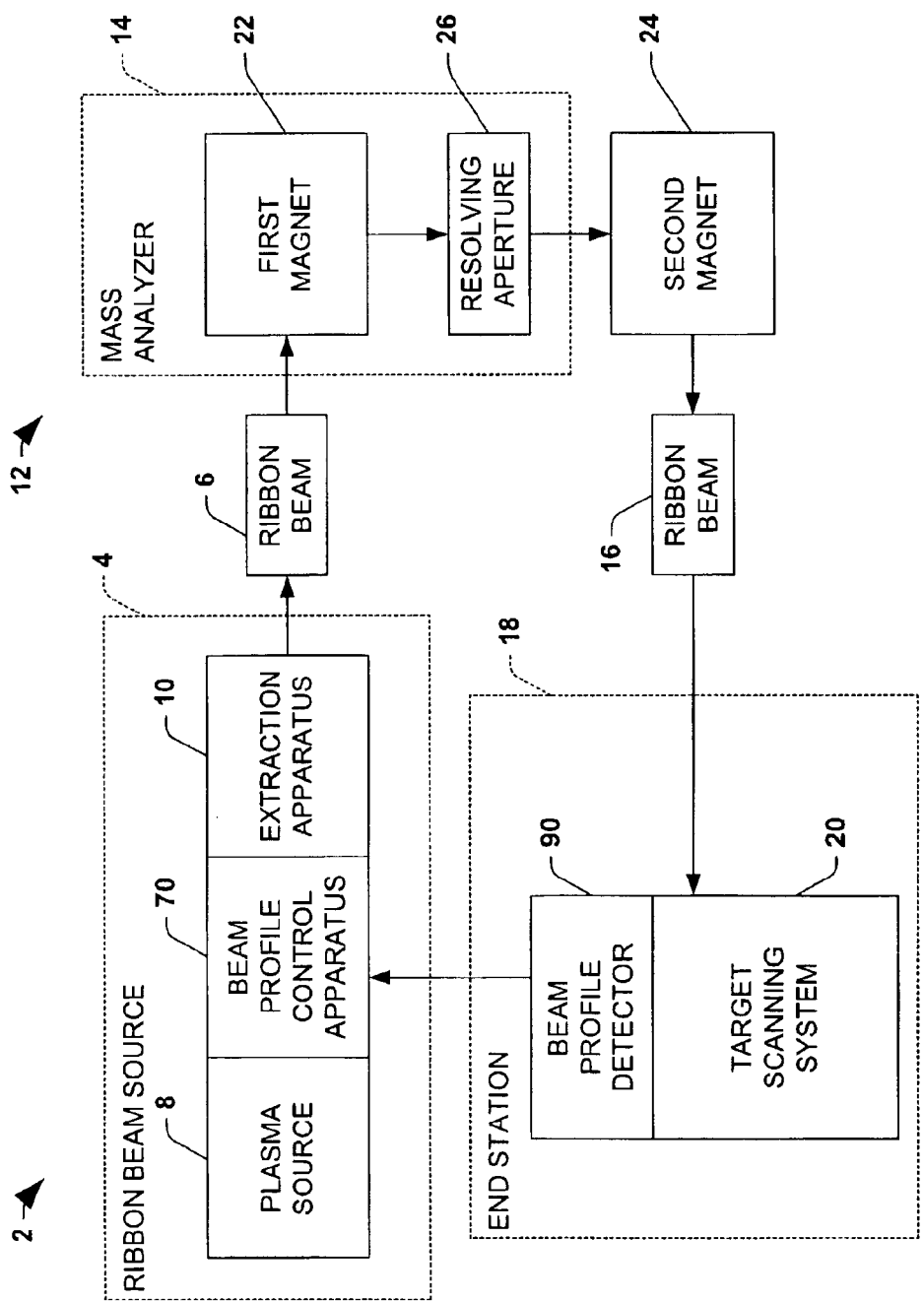
FIG. 6 is a schematic diagram illustrating a beam profile detector and profile control apparatus in the ion implantation system.

Referring also to FIG. 6, beam density profile control may be done according to a desired profile at the source 4, or according to a desired profile downstream at the end station 18 using known control algorithms, including but not limited to feedback, feed-forward, predictive or other types. This provides utility, for example, in correcting or compensating for non-uniformities in the source 4 or in downstream devices in the implantation system 2. Thus, the implantation system 2 may include a beam profile detector 90 located at the end station 18 to measure the density profile of the beam 16 as it is imparted on a target wafer or wafers, and to provide corresponding measurement signals to the control system 72 of the control apparatus 70. The control system 72, in turn, may make appropriate adjustments to energize the electro-magnets 80 (e.g., using the power supplies 74) so as to correct for any deviations from the desired profile at the workpiece. The beam profile detector 90 may be of any appropriate type, for example, such as a plurality of Faraday cups positioned in the end station 18 so as to detect an actual density profile associated with the elongated mass analyzed ion beam 16.

The exemplary ion implantation system 2 illustrated and described above provides for an elongated ribbon beam of uniform density having a generally rectangular transverse profile, which may be advantageously employed with a serial implantation end station 18. In such an application, the resulting mass analyzed ribbon beam 16 may be scanned across the wafer surface, for example, using a single-scan mechanical translation of the target wafer (not shown). The invention also finds application in association with batch implant type target scanning systems 20, wherein a plurality of wafers may be angularly translated through the path of the elongated mass analyzed ion beam 16. In such applications, the extraction slits 10b of the extraction apparatus 10 may be trapezoidal in shape, in order to accommodate the angular scanning of the wafer surfaces, thereby providing uniformity in the implantation of the wafers. It will be appreciated that many other such modifications may be made to the illustrated apparatus and systems without departing from the scope of the present invention.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention includes a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising".

What is claimed is:

1. An ion implantation system for implanting one or more workpieces with an ion beam, comprising:
    an ion source producing an elongated input ion beam along a longitudinal path, the input ion beam comprising a first transverse width and a first transverse height near the source, the first transverse width and the first transverse height defining a first aspect ratio as a ratio of the first transverse width and the first transverse height, wherein the first transverse width is larger than the first transverse height,
    a beamline system comprising a mass analyzer positioned downstream from the ion source along the path to receive the elongated input ion beam at an entrance end of the beamline assembly, the mass analyzer providing a magnetic field across the path so as to deflect ions from the input ion beam at varying trajectories according to mass to provide an elongated mass analyzed ion beam including ions of a desired mass, the mass analyzed ion beam comprising a second transverse width and a second transverse height at an exit end of the beamline assembly, the second transverse width and the second transverse height defining a second aspect ratio as a ratio of the second transverse and the second transverse height; and
    an end station proximate the exit end of the beamline assembly, the end station receiving the mass analyzed ion beam from the beamline system and supporting at least one workpiece along the path for implantation using the mass analyzed ion beam;
    wherein the second aspect ratio is substantially the same as the first aspect ratio.

2. The ion implantation system of claim 1, wherein the beamline system comprises:
    a first magnet providing a first magnetic field to the elongated input ion beam from the ion source, the first magnetic field operating to direct individual ions of a desired mass along the path and to deflect ions of undesired mass away from the path; and
    a second magnet located downstream of the first magnet along the path, the second magnet providing a second magnetic field to the ions of the desired mass along the path between the first magnet and the end station, the second magnetic field operating to direct individual ions of the desired mass to the end station as the elongated mass analyzed ion beam.

3. The ion implantation system of claim 2, wherein the first and second magnets provide the first and second magnetic fields so as to guide individual ions of the desired mass across the width of the ion beam at the ion source to the end station such that the individual ions of the desired mass travel generally equal distances between the ion source and the end station.

4. The ion implantation system of claim 3, wherein the first transverse width of the elongated input ion beam is about 400 mm near the ion source, and wherein the second transverse width of the elongated mass analyzed ion beam about 400 mm near the end station.

5. The ion implantation system of claim 2, wherein the first magnet comprises a mass analyzer magnet and the second magnet comprises a collimator magnet.

6. The ion implantation system of claim 2, wherein the first and second magnets are substantially identical.

7. The ion implantation system of claim 1, wherein the first transverse width of the elongated input ion beam is about 400 mm near the ion source, and wherein the second transverse width of the elongated mass analyzed ion beam about 400 mm near the end station.

8. The ion implantation system of claim 1, wherein the mass analyzer comprises a beamguide located along the path, the beamguide defining a beam cavity through which the ion beam travels from the entrance end to the exit end, wherein the mass analyzer provides the magnetic field across the path through at least a portion of the beamguide to guide individual ions of a desired mass across the width of the input ion beam at the entrance end through the beam guide to the exit end such that the individual ions of a desired mass travel generally equal distances between the entrance and exit ends of the beamguide.

9. The ion implantation system of claim 8, wherein the mass analyzer comprises first and second magnets and the beamguide comprises a resolving aperture between the first and second magnets along the path;
    wherein the first magnet is positioned near the entrance end to provide a first magnetic field along the path between the entrance end and the resolving aperture so as to deflect ions from the input ion beam at varying trajectories according to mass, the first magnetic field operating to direct individual ions of a desired mass through the resolving aperture along the path and to deflect ions of undesired mass away from the aperture;
    wherein the resolving aperture is positioned downstream of the first magnet along the path and comprises a transverse width and a transverse height defining a resolving aperture aspect ratio different from the first and second aspect ratios; and wherein the second magnet is positioned near the exit end along the path to receive ions of a desired mass traveling through the resolving aperture, the second magnet providing a second magnetic field along the path between the resolving aperture and the exit end, the second magnetic field operating to direct individual ions of the desired mass from the resolving aperture to the exit end along the path so as to provide the mass analyzed ion beam comprising the second aspect ratio.

10. The ion implantation system of claim 9, wherein the first and second magnets provide the first and second magnetic fields so as to guide individual ions of the desired mass across the width of the input ion beam at the ion source to the end station such that the individual ions of the desired mass travel generally equal distances between the ion source and the end station.

11. The ion implantation system of claim 9, wherein the first magnet comprises a mass analyzer magnet and the second magnet comprises a collimator magnet.

12. The ion implantation system of claim 9, wherein the first and second magnets are substantially identical.

13. The ion implantation system of claim 9, wherein the first transverse width of the elongated input ion beam is about 400 mm near the ion source, and wherein the second transverse width of the elongated mass analyzed ion beam is about 400 mm near the end station.

14. The ion implantation system of claim 9, wherein the end station further comprises a beam profile detector detecting a density profile associated with the elongated mass analyzed ion beam at the end station, and wherein the ion source further comprises a beam profile control apparatus operable to adjust a density profile associated with the elongated input ion beam near the ion source according to a detected density profile associated with the elongated mass analyzed ion beam at the end station.

15. The ion implantation system of claim 14, wherein the beam profile detector comprises a plurality of Faraday cups positioned in the end station so as to detect an actual density profile associated with the elongated mass analyzed ion beam.

16. The ion implantation system of claim 15, wherein the plurality of Faraday cups are positioned proximate a workpiece being implanted.

17. The ion implantation system of claim 9, wherein the beamline system further comprises a plurality of quadrupole magnets positioned proximate the resolving aperture, the quadrupole magnets providing adjustment of a beam waist location along the path.

18. The ion implantation system of claim 9, wherein the beamguide further comprises a plurality of magnets providing multi-cusped magnetic fields along at least a portion of the path for beam confinement along the path within the beamguide near the resolving aperture.

19. The ion implantation system of claim 18, wherein the beamguide further comprises a waveguide proximate the resolving aperture and a microwave power source connected to the waveguide, the microwave power source providing microwave power to the waveguide for beam confinement along the path within the beamguide near the resolving aperture.

20. The ion implantation system of claim 19, wherein the microwave power and the multi-cusped magnetic fields interact within the beamguide to provide an electron-cyclotron resonance condition for beam confinement along the path within the beamguide near the resolving aperture.

21. The ion implantation system of claim 1, wherein the first transverse width of the elongated input ion beam and the second transverse width of the elongated mass analyzed ion beam are substantially the same.

22. A beamline system for providing an elongated mass analyzed ion beam to an end station in an ion implantation system, the beamline system comprising:

a first magnet receiving an elongated input ion beam along a path, the elongated input ion beam having a first transverse width and a first transverse height defining a first aspect ratio as a ratio of the first transverse width and the first transverse height, the first magnet providing a first magnetic field to the elongated input ion beam to direct individual ions of a desired mass along the path and to deflect ions of undesired mass away from the path; and a second magnet located downstream of the first magnet along the path, the second magnet providing a second magnetic field to the ions of the desired mass along the path between the first magnet and the end station to direct individual ions of the desired mass to the end station in the form of an elongated mass analyzed ion beam comprising a second transverse width and a second transverse height defining a second aspect ratio as a ratio of the second transverse width and the second transverse height;

wherein the second aspect ratio is substantially the same as the first aspect ratio.

23. The beamline system of claim 22, comprising an entrance end and an exit end, wherein the first magnet receives the elongated input ion beam near the entrance end and the second magnet provides the elongated mass analyzed ion beam near the exit end, and wherein the first and second magnets provide the first and second magnetic fields so as to guide individual ions of the desired mass across the width of the input ion beam at the ion source to the exit end such that the individual ions of the desired mass travel generally equal distances between the entrance and exit ends.

24. The beamline system of claim 22, wherein the first and second magnets are substantially identical.

25. The beamline system of claim 22, further comprising a beamguide located along the path, the beamguide defining a beam cavity through which the elongated input ion beam travels from the entrance end to the exit end, wherein the first and second magnets provide the first and second magnetic fields across the path through first and second portions of the beamguide, respectively, to guide individual ions of a desired mass across the first transverse width of the input ion beam at the entrance end through the beam guide to the exit end such that the individual ions of a desired mass travel generally equal distances between the entrance and exit ends.

26. The beamline system of claim 25, further comprising a resolving aperture positioned between the first and second magnets along the path;

wherein the first magnet is positioned near the entrance end to provide the first magnetic field along the path between the entrance end and the resolving aperture so as to deflect ions from the elongated input ion beam at varying trajectories according to mass, the first magnetic field operating to direct individual ions of a desired mass through the resolving aperture along the path and to deflect ions of undesired mass away from the aperture;

wherein the resolving aperture is positioned downstream of the first magnet along the path and comprises a transverse width and a transverse height defining a resolving aperture aspect ratio different from the first and second aspect ratios; and wherein the second magnet is positioned near the exit end of the beamguide along the path to receive ions of a desired mass traveling through the resolving aperture, the second magnet providing the second magnetic field along the path between the resolving aperture and the exit end, the second magnetic field operating to direct individual ions of the desired mass from the resolving aperture to the exit end along the path so as to provide the mass analyzed ion beam comprising the second aspect ratio.

27. The beamline system of claim 22, wherein the first transverse width of the elongated input ion beam and the second transverse width of the elongated mass analyzed ion beam are substantially the same.

28. A method of implanting a workpiece using an ion beam in an ion implantation system, comprising:

creating an elongated input ion beam having a first aspect ratio, the first aspect ratio being a ratio of a first transverse width and a first transverse height of the input ion beam;

mass analyzing the elongated input ion beam using a first magnetic field;

collimating the ion beam using a second magnetic field to provide an elongated mass analyzed ion beam having a second aspect ratio, the second aspect ratio being defined as a ratio of a second transverse width and a second transverse height of the mass analyzed ion beam, wherein the first and second aspect ratios are substantially the same; and providing at least a portion of the elongated mass analyzed ion beam to at least one workpiece so as to implant the at least one workpiece with ions from the elongated mass analyzed ion beam.

29. The method of claim 28, wherein mass analyzing and collimating the elongated ion beam comprises providing the first and second magnetic fields to direct ions of a desired mass from an ion source to the at least one workpiece wherein individual ions of the desired mass travel generally equal distances between the ion source and the at least one workpiece.

30. An ion implantation system for implanting a workpiece using an ion beam, comprising:

means for creating an elongated input ion beam having a first aspect ratio the first aspect ratio being a ratio of a first transverse width and a first transverse height of the input ion beam;

means for mass analyzing the elongated input ion beam using a first magnetic field;

means for collimating the ion beam using a second magnetic field to provide an elongated mass analyzed ion beam having a second aspect ratio substantially the same as the first aspect ratio, the second aspect ratio being defined as a ratio of a second transverse width and a second transverse height of the mass analyzed ion beam; and means for providing at least a portion of the elongated mass analyzed ion beam to at least one workpiece so as to implant the at least one workpiece with ions from the elongated mass analyzed ion beam.

31. The system of claim 30, wherein the means for mass analyzing the elongated input ion beam comprises a first magnet, and wherein the means for collimating the ion beam comprises a second magnet substantially identical to the first magnet.

* * * * *